US006614591B1

(12) United States Patent
Cooper et al.

(10) Patent No.: US 6,614,591 B1
(45) Date of Patent: Sep. 2, 2003

(54) OPTICAL COMBINER

(75) Inventors: Thomas Robert Cooper, Torrance, CA (US); Joshua Aaron Conway, Hermosa Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/163,954

(22) Filed: Jun. 6, 2002

(51) Int. Cl.[7] .............................. H01S 3/00; H04B 10/00; H04B 7/185
(52) U.S. Cl. ....................... 359/349; 359/172; 455/12.1
(58) Field of Search ............................... 359/333, 349, 359/172; 455/12.1

(56) References Cited

U.S. PATENT DOCUMENTS

| | | | | |
|---|---|---|---|---|
| 5,222,246 A | * | 6/1993 | Wolkstein | 455/13.4 |
| 5,661,582 A | * | 8/1997 | Kintis et al. | 359/172 |
| 5,859,611 A | * | 1/1999 | Lam et al. | 342/368 |
| 6,151,481 A | * | 11/2000 | Wilson et al. | 455/13.3 |
| 6,173,155 B1 | * | 1/2001 | Norin | 455/12.1 |

FOREIGN PATENT DOCUMENTS

CA 2266281 * 9/2000

* cited by examiner

*Primary Examiner*—Mark Hellner
(74) *Attorney, Agent, or Firm*—Terje Gudmestad (57) ABSTRACT

A high power optical combiner (18) is provided for amplifying an optical signal. The combiner (18) includes a splitter (20) having a splitter input (22) and two splitter outputs (24, 26). The splitter input (22) receives an optical signal which the splitter divides (20) into two sub-signals. The splitter outputs (24, 26) have respectively coupled thereto a reference arm (30) and a dither arm (32). Both arms (30, 32) receive the sub-signals from the respective splitter outputs (24, 26) and transmit the sub-signals in parallel. Each arm (30, 32) has an amplifier (34) integrated therein for amplifying the sub-signals in parallel thereby producing amplified sub-signals. The high power optical combiner (18) further includes a combining coupler (42) connected to both arms (30, 32). The combining coupler (42) has two coupler inputs (46, 48), and a coupler output (50). The coupler inputs (46, 48) receive the amplified sub-signals from the arms (30, 32). The combining coupler (42) constructively combines the amplified sub-signals to produce a primary amplified signal that is transmitted through the coupler output (50). The coupler output (50) has a dither tap coupler (58) attached thereto for drawing a secondary amplified signal from the primary amplified signal. The secondary amplified signal is coupled to a phase controller (52) and a polarization controller (54), both of which are coupled to the dither arm (32) between the splitter (20) and the amplifier (34). These controllers (52, 54) respectively adjust the phase and the polarization of the sub-signal in the dither arm (32) to allow for efficient combination of the amplified sub-signals.

20 Claims, 3 Drawing Sheets

OPTICAL COMBINER

TECHNICAL FIELD

The present invention relates generally to intersatellite communication, and more particularly to a high power optical combiner that allows for high data rates necessary for intersatellite communication.

BACKGROUND OF THE INVENTION

Double-hop transmission is a condition where two ground stations may indirectly communicate with each other with the assistance of an intermediate ground station. A double-hop satellite link typically arises where two ground stations are sufficiently remote from each other that they do not have a direct link to the same satellite. As a result, the signal travels through space twice.

In particular, a transmitting ground station sends the signal through a first satellite to the intermediate ground station. Then, the intermediate ground station sends the signal through a second satellite to a recipient ground station.

Several disadvantages of double-hop satellite links are known. Double-hop satellite links double the satellite delay normally attributed to direct satellite links. Also, double-hop transmission is known for producing an inconvenient delay in sound for video conferencing. In this regard, a user may see parts of a video transmission before the associated sound is played. Furthermore, service costs may be doubled and security problems may arise with the use of an additional satellite and an additional ground station.

One proposed solution discloses serially cascading amplifiers for providing the necessary power for intersatellite communication. As is known in the art, a significant amount of optical power, e.g. about 4 Watts, is required for intersatellite communication. Intersatellite communication would eliminate the need to communicate through an intermediate ground station thereby alleviating the problems associated with double-hop transmission.

However, serially cascading stages can only be effective for a relatively small number of stages and moderate output powers. As more stages are added, amplifier spontaneous emission (ASE) is also amplified. This high power noise depletes the population inversion and consequently decreases the overall efficiency of the amplifier. In other words, the additional stages may even reduce power of the output signal. Also, the addition of stages typically increases the weight and power consumption of the amplifier.

Therefore, a need exists for an apparatus that provides sufficient optical power for intersatellite communication without increasing ASE.

SUMMARY OF THE INVENTION

It is therefore an object of the present invention to provide a high power optical combiner for enabling the transmission of substantial amounts of electronic data at high data rates.

In accordance with the above and other objects of the present invention, a high power optical combiner is provided. In one embodiment, the high power optical combiner includes a splitter having a splitter input and two splitter outputs. The splitter input receives an optical signal which the splitter divides into two sub-signals. The splitter outputs have coupled thereto a reference arm and a dither arm. Both arms transmit the sub-signals in parallel and have integrated therein an amplifier for amplifying the sub-signals in parallel. Furthermore, each arm is connected to a coupler input of a combining coupler. The combining coupler constructively combines the amplified sub-signals to produce a primary amplified signal that is transmitted through the coupler output.

The coupler output has a dither tap coupler attached thereto for drawing a secondary amplified signal from the primary amplified signal. The secondary amplified signal is coupled to a phase controller and a polarization controller, both of which are also coupled to the dither arm between the splitter and the amplifier. The phase controller and the polarization controller respectively adjust the phase and the polarization of the sub-signal in the dither arm so as to allow for efficient combination of the amplified sub-signals.

One advantage of the invention is that sufficient power can be provided to an optical signal for allowing intersatellite communication.

Another advantage of the present invention is that amplified spontaneous emission or "noise" is kept relatively low despite substantial amplification of the optical signal.

Still another advantage of the invention is that a relatively low power supply is required to operate the invention.

Yet another advantage of the invention is that the high power optical combiner is relatively light weight thereby increasing efficient manufacture of satellites, as well as various other device employing high power optical combiners.

Another advantage of the invention is that semiconductor lasers may be employed as an amplifier and a phase adjustment element. Semiconductor lasers are of a mature technology and therefore have high reliability and efficiency.

Other advantages of the present invention will become apparent when viewed in light of the detailed description of the preferred embodiment when taken in conjunction with the attached drawings and appended claims.

DESCRIPTION OF THE PREFERRED EMBODIMENT

In the following figures the same reference numerals will be used to illustrate the same components in the various views. The present invention is particularly suited for high-speed communication systems, e.g. satellite communication systems. However, it is understood that the present invention may be employed in various other types of communication systems.

Figure 1:
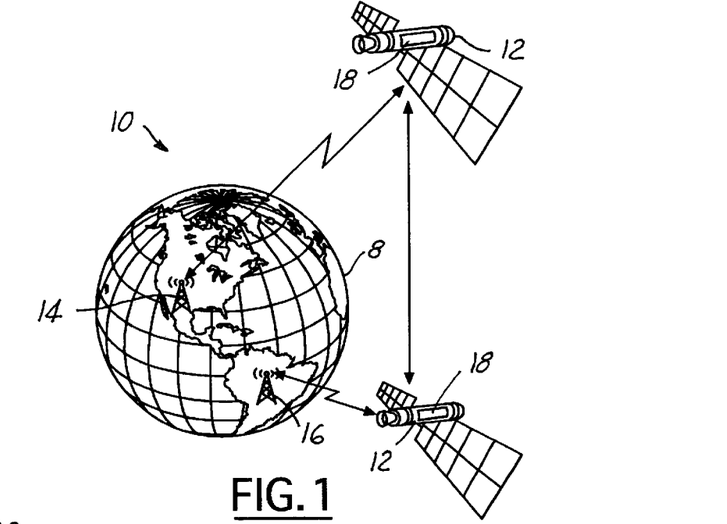
FIG. 1 is a perspective view of a satellite communication system in accordance with a preferred embodiment of the present invention.

Referring now to FIG. 1, there is shown a perspective view of a satellite communication system 10 in accordance with a preferred embodiment of the present invention. The satellite communication system 10 includes a pair of satellites 12 that allow for communication between a first ground station 14 positioned on earth 8 and a second ground station 16 positioned on earth 8 remote from the first ground station 14. Each satellite 12 includes a high power optical combiner 18 for enabling high data rates necessary for intersatellite communication.

As mentioned above, it is understood that this satellite communication system 10 merely exemplifies one particular embodiment in which a high power optical combiner 18 may be employed. For example, the ground stations 14, 16 may be positioned at any distance relative to each other. Also, it is understood that more than two satellites may be utilized if desired.

Figure 2:
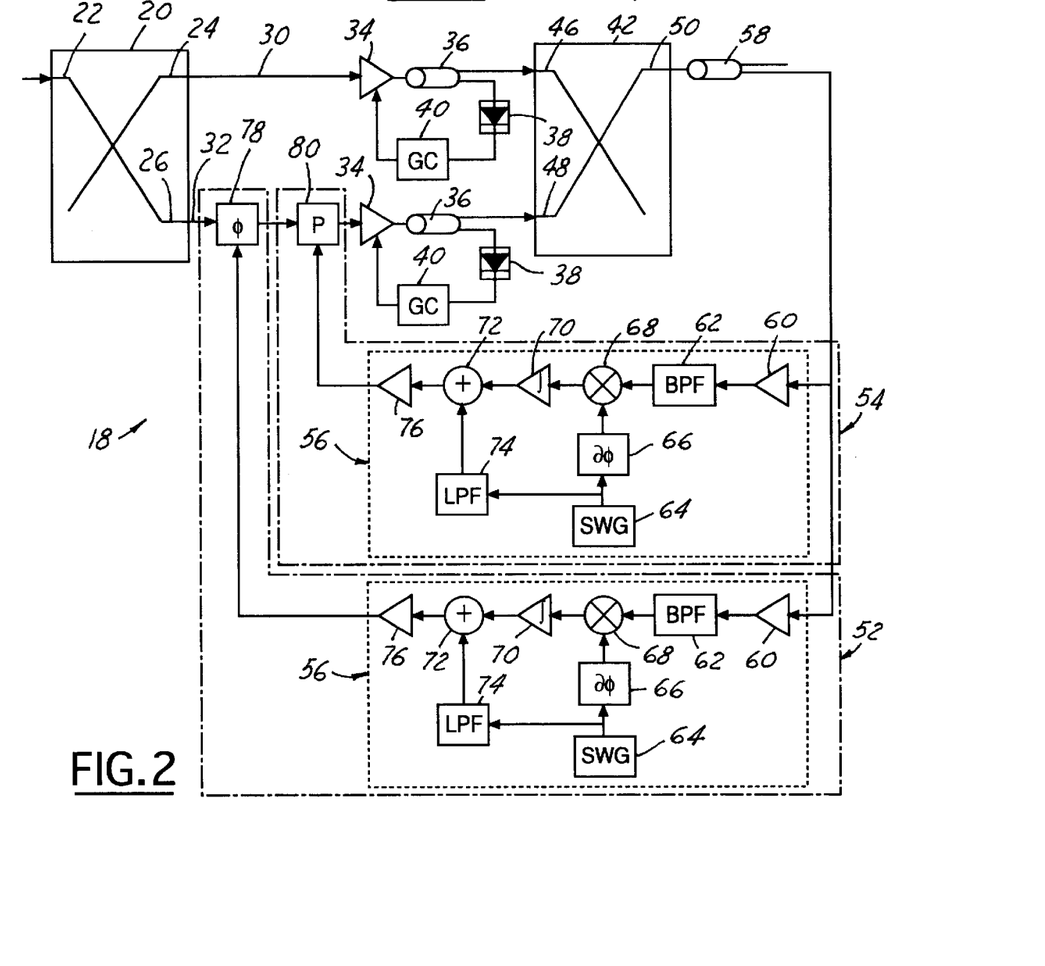
FIG. 2 is a schematic diagram of a high power optical combiner in accordance with a preferred embodiment of the present invention.
Figure 3:
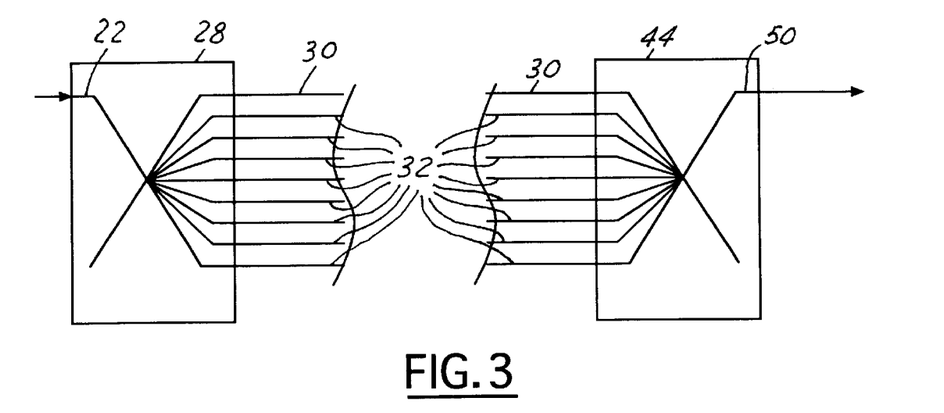
FIG. 3 is a schematic diagram of a high power optical combiner having a 1×N splitter and an N×1 coupler in accordance with an alternative embodiment of the present invention.
Figure 4:
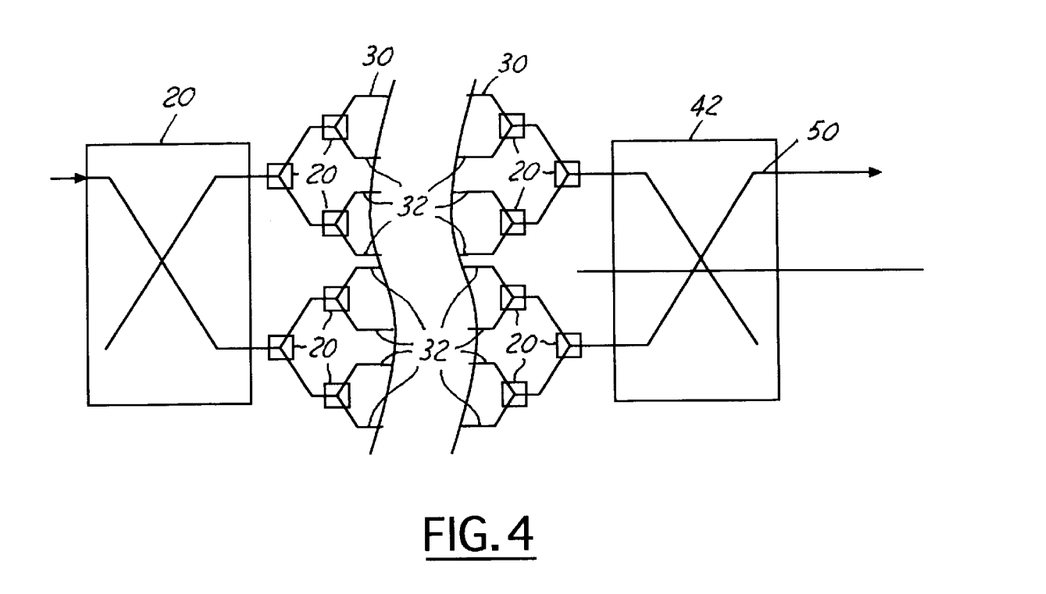
FIG. 4 is a high power optical combiner having multiple 50:50 splitters, in accordance with an alternative embodiment of the present invention.

Referring now to FIG. 2, there is shown a schematic of a high power optical combiner 18 ("combiner") in accordance with a preferred embodiment of the present invention. The combiner 18 preferably includes a 50:50 splitter 20 having a splitter input 22, a first splitter output 24, and a second splitter output 26. However, it is understood that other suitable splitters may be employed. For example, as shown in FIG. 3, a 1×N splitter 28 having one splitter input 22 and two or more splitter outputs may be used. Also, as shown in FIG. 4, a series of 50:50 splitters 20 may be used to allow for multiple splitter outputs.

Referring back to FIG. 2, the splitter input 22 preferably receives an optical signal which the splitter 20 divides into two sub-signals. These sub-signals are transmitted through the first splitter output 24 and the second splitter output 26. The first splitter output 24 and the second splitter output 26 have respectively coupled thereto a reference arm 30 and a dither arm 32. Both of these arms 30, 32 preferably are planar lightwave circuits ("PLCs"). As is known in the art, PLCs may be constructed of many materials, e.g. semiconductors or silica-on-silicon. PLCs are also known for increasing the stability of the component and providing manufacture thereof within relatively small tolerances. However, it is understood that the arms 30, 32 may be any optical waveguide (OWG) structure. For example, the arms 30, 32 may instead be lengths of optical fiber used to transmit the sub-signals in parallel.

The reference arm 30 and the dither arm 32 each have an amplifier 34 integrated therein for amplifying the sub-signals. In particular, each amplifier 34 preferably is a semiconductor laser coupled to a section of each arm 30, 32. These sections are doped with erbium, erbium-ytterbium, or other suitable dopants. Erbium is the preferred dopant for signals having a 1550 nanometer wavelength. However, erbium-ytterbium is preferred where high power amplification is desired.

As is known in the art, the laser would be used to illuminate the doped sections so as to excite electrons therein to higher energy levels. In the presence of a sub-signal, these electrons would drop to a lower energy level and cause an emission of photons having the same phase and the same frequency as the sub-signal. As a result, the sub-signal is amplified by the semiconductor laser.

The doped section is preferably pumped by a laser having either a 980 nanometer wavelength or a 1480 nanometer wavelength. As is known in the art, a 980 nanometer wavelength laser allows for low noise amplification whereas a 1480 nanometer wavelength laser allows for high power amplification.

Preferably, each amplifier 34 further includes a feedback control loop for stabilizing the gain across both arms 30, 32.

As is known in the art, power balance between the arms 30, 32 is required for effective combination of the amplified sub-signals.

The feedback control loop preferably includes a gain tap coupler 36 integrated within each arm 30, 32 for drawing an optical feedback signal. The optical feedback signal preferably is a small percentage of the amplified sub-signal that represents the power of the sub-signal.

Each gain tap coupler 36 has an optical-to-electrical converter 38 attached thereto for converting the optical feedback signal into an electrical feedback signal. The optical-to-electrical converter 38 preferably is a photodetector, but may be other suitable devices if desired.

Moreover, each optical-to-electrical converter 38 has a gain controller 40 coupled thereto for receiving the electrical feedback signal and determining whether more or less power should be supplied to the semiconductor laser. Accordingly, each gain controller 40 regulates the power supplied to the laser in a manner that stabilizes gain across all the arms 30, 32.

Preferably, each gain controller 40 determines whether more or less power should be supplied to the respective semiconductor laser by comparing the electrical feedback signal to a predetermined power value. In general, the predetermined power value is approximately equal to the desired optical signal power divided by the number of arms. The desired optical signal power preferably is about 4 Watts for providing the high data rates typically required for intersatellite communication. By way of example, a combiner 18 having two arms would require that each sub-signal be amplified to about 2 Watts.

If the gain controller 40 determines that the electrical feedback signal is greater than the predetermined power value, then the gain controller 40 decreases the power supply to the semiconductor laser. On the other hand, if the gain controller 40 determines that the electrical feedback signal is less than the predetermined power value, then the gain controller 40 increases the power supply to the semiconductor laser.

In an alternative embodiment, the gain controllers 40 are coupled to each other for the purpose of stabilizing gain across the arms 30, 32. For example, similar to the preferred embodiment, the reference arm 30 may have a gain controller 40 integrated therein that compares its electrical feedback signal to a predetermined value and then regulates its semiconductor laser accordingly. However, in the alternative embodiment, the dither arm 32 may have a gain controller 40 integrated therein that compares its electrical feedback signal to the electrical feedback signal in the reference arm and then regulates its semiconductor laser in a manner that equalizes its electrical feedback signal to the reference arm's electrical feedback signal. Of course, the gain may be stabilized across the arms by a variety of other suitable methods.

Referring back to FIG. 2, the preferred embodiment further includes a 50:50 combining coupler 42 having a first coupler input 46, a second coupler input 48, and a coupler output 50. The first coupler input 46 and the second coupler input 48 are respectively coupled to the reference arm 30 and the dither arm 32 so as to receive the amplified sub-signals therefrom. The combining coupler 42 combines the amplified sub-signals to form a primary amplified signal which is transmitted through the coupler output 50. Preferably, the primary amplified signal is sufficiently powerful for allowing high data rates and intersatellite communication.

However, where more than one dither arm 32 is employed, it is understood that the combining coupler may be a N×1 coupler 44 or a series of 50:50 couplers 42 as shown in FIGS. 3 and 4.

Furthermore, the combiner 18 also includes a phase controller 52 and a polarization controller 54, both coupled between the combining coupler 42 and the dither arm 32. The phase controller 52 and the polarization controller 54 align the sub-signal in the dither arm 32 with the sub-signal in the reference arm 30 so as to allow for efficient combination of the amplified sub-signals.

The phase controller 52 and the polarization controller 54 each include a dither detector 56. Preferably, each dither detector 56 is connected to the coupler output 50 via a dither tap coupler 58 for drawing a secondary amplified signal from the primary amplified signal. The secondary amplified signal may be a relatively small percentage of the primary amplified signal. Consequently, a pre-amplifier 60 preferably is used to increase the power of the secondary amplified signal and permit efficient dithering of the secondary amplified signal. However, it is understood that the pre-amplifier 60 may not be utilized if desired.

With reference to the combiner 18 as described above, a person skilled in the art will understand that the combiner 18 is akin to a conventional interferometer with amplifiers 34 and a gain feedback control loop integrated therein. In this respect, at the output of the combiner 18, the electric fields of the amplified sub-signals may be added together and power can be balanced between the primary amplified signal and the secondary amplified signal. In this regard, where the secondary amplified signal encompasses 0% of the energy derived from combining the amplified sub-signals, the primary amplified signal may encompass 100% of the power from combining the amplified sub-signals. Alternatively, the power may be distributed between the two signals by various other apportionments.

In view of the above described structure of the phase controller 52, one skilled in the art will understand that the phase controller 52 is powered by the secondary amplified signal. In this respect, the phase controller 52 only adjusts the phase of the sub-signal in the dither arm 32 when the power of the secondary amplified signal is greater than zero. This configuration is beneficial because, as one skilled in the art of interferometers would understand, the primary amplified signal is maximized where the secondary amplified signal is minimized.

Likewise, the polarization controller 54 aligns the sub-signals for efficient combination. As one skilled in the art will also understand, if the polarization of the electric fields are aligned, then constructive interference can occur thereby increasing the power of either the primary amplified signal or the secondary amplified signal.

A band pass filter 62 preferably is connected to the pre-amplifier 60 and receives the secondary amplified signal therefrom. The band pass filter 62 allows a filtered signal having a desired frequency to pass therethrough and rejects the noise. In this regard, each dither detector 56 permits only one frequency to pass therethrough. As a result, dithers of different frequencies can be applied for allowing phase control and polarization control without cross-talk between these controllers 52, 54. For example, a dither detector 56 having a band pass filter 62 tuned to 100 Hz may be used for controlling the phase of a sub-signal, and another dither detector 56 having a band pass filter 62 tuned to 93 Hz may be used for controlling the polarization of a sub-signal.

Furthermore, each dither detector 56 further includes a square wave generator 64 that produces a first sinusoidal signal at a frequency equal to the filtered signal passing through the band pass filter 62. A phase modulator 66 is coupled to the square wave generator 64 and receives the first sinusoidal wave therefrom. The phase modulator 66 aligns the phase of the filtered signal with the first sinusoidal signal.

A mixer 68 is coupled to the band pass filter 62 and the phase modulator 66. The mixer 68 receives the filtered signal from the band pass filter 62 and the first sinusoidal signal from the phase modulator 66. The mixer 68 multiplies the filtered signal by the first sinusoidal signal at the same frequency and the same phase so as to produce a composite signal.

An integrator 70 is coupled to the mixer 68 and receives the composite signal therefrom. The integrator 70 produces an average DC output based upon the composite signal.

A summer 72 is coupled to the integrator 70 and receives the average DC output therefrom. Furthermore, the summer 72 is coupled to a low pass filter 74 for receiving a second sinusoidal signal produced by the square wave generator 64. The second sinusoidal signal passes from the square wave generator 64 through the low pass filter 74 to the summer 72. The summer 72 adds the second sinusoidal signal from the square wave generator 64 and the average DC output from the integrator 70 to produce a dither output.

The phase controller 52 preferably includes a drive amplifier 76 that receives the dither output from the summer 72 and produces a current for operating a phase adjusting element 78. The phase adjusting element 78 may be a piezoceramic device, a semiconductor laser, or other suitable device.

Likewise, the polarization controller 54 preferably includes a drive amplifier 76 that receives the dither output from the summer 72 and produces a current for operating the polarization adjusting element 80. The polarization adjusting element 80 may be a piezoelectric transducer employed for stressing the arm, a piezoceramic device, a liquid crystal, a piezoelectric transducer employed for stressing the arm, or other suitable materials.

Although the preferred embodiment discloses a combiner 18 having only one dither arm 32, one skilled in the art would understand that the combiner 18 may have more than one dither arm 32 as shown in FIGS. 3 and 4.

Figure 5:
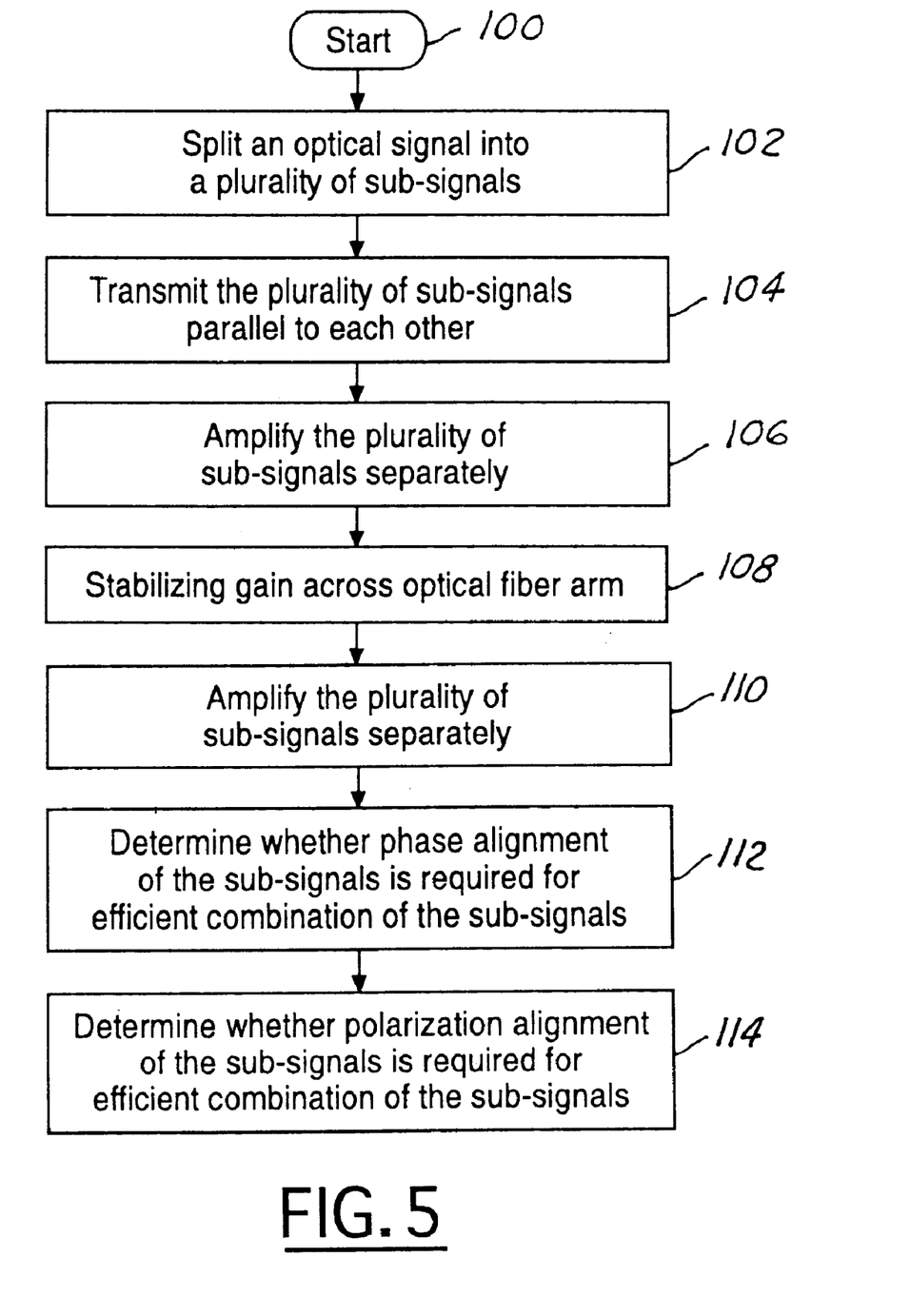
FIG. 5 is a flowchart depicting a method for amplifying a sub-signal in accordance with a preferred embodiment of the present invention.

Referring now to FIG. 5, there is shown a flowchart depicting a method for amplifying an optical signal in accordance with a preferred embodiment of the present invention. The sequence commences at step 100 and immediately proceeds to step 102.

In step 102, the optical signal is split into a plurality of sub-signals. This step is accomplished by using one or more splitters 20. Splitters 20 are electrical elements that are well known in the art for dividing optical signals. Preferably, the optical signal is split into two sub-signals by a 50:50 splitter 20 (as shown in FIG. 1). However, the optical signal may be divided into three or more sub-signals as desired (as shown in FIGS. 2 and 3). In this regard, a 1×N splitter 28 or a series of 50:50 splitters 20 may be employed. Then, the sequence proceeds to step 104.

In step 104, the sub-signals are transmitted in parallel to each other. This step may be accomplished by using any optical waveguide (OWG) structure. Preferably, planar lightwave circuits (PLCs) are used to transmit the sub-signals in parallel. Alternatively, lengths of optical fiber may be employed to accomplish this step. Optical fiber is of a mature technology well known in the art.

The OWG structures include a reference arm 30 and at least one dither arm 32. Each arm 30, 32 is attached to an output of the splitter 20 and receives a sub-signal therefrom. The sequence then proceeds to step 106.

In step 106, each sub-signal is separately amplified by an amplifier 34. Amplification of optical signals is a process that is also well known in the art. This step may be accomplished by employing a semiconductor laser to lase doped sections of the arms and then transmitting the sub-signals through those sections. As mentioned above, the laser may provide a wavelength of 980 nanometers for low noise amplification or 1480 nanometers for higher power amplification.

Preferably, each laser amplifies the respective sub-signal such that the power of the sub-signal is equal to the desired optical signal power divided by the number of arms. For example, where the desired optical signal power is 4 Watts and the combiner 18 has two arms, each laser preferably amplifies the respective sub-signal to about 2 Watts. Then, the sequence proceeds to step 108.

In step 108, it is determined whether gain across each arm 30, 32 is equal. One skilled in the art would understand that effective combination of the sub-signals requires that the gain for each sub-signal is approximately equal to each other. In doing so, an optical feedback signal is drawn from each amplified sub-signal. The optical feedback signal is a small percentage of the amplified sub-signal. Preferably, a gain tap coupler 36 is connected to each arm for drawing the optical feedback signal from each arm.

Thereafter, the optical feedback signal is converted into an electrical feedback signal. As is known in the art, this step may be accomplished by employing an optical-to-electrical converter 38, such as a photodetector. The optical-to-electrical converter 38 receives the optical feedback signal from the gain tap coupler 36 and then converts the optical feedback signal into an electrical feedback signal.

Preferably, each optical-to-electrical converter 38 has a gain controller coupled thereto for receiving the electrical feedback signal from the optical-to-electrical converter 38 and then comparing the electrical feedback signal to a predetermined power value.

If the electrical feedback signal indicates a gain that is greater than the predetermined power value, then the gain controller 40 decreases the power supply to the amplifier 34. However, if the electrical feedback signal indicates a gain that is less than the predetermined power value, then the gain controller 40 increases the power to the amplifier 34.

In an alternative embodiment, step 108 is accomplished by comparing the electrical feedback signal of one gain controller 40 to the electrical feedback signal of another gain controller 40. For example, a first gain controller would compare its electrical feedback signal to a predetermined power value and regulate its semiconductor laser to produce a gain equal to the predetermined power value. Furthermore, a second gain controller would compare its electrical feedback signal to the electrical feedback signal of the first gain controller and regulate its semiconductor laser to produce a gain equal to the gain produced by the first semiconductor laser. After completing step 108, the sequence proceeds to step 110.

In step 110, the amplified sub-signals are combined into a primary amplified signal. This step is preferably accomplished by attaching a combining coupler 42 to each arm for receiving the amplified sub-signals therefrom. Couplers are well known devices that can constructively combine two or more signals into a single, more powerful signal. Then, the sequence proceeds to step 112.

In step 112, it is determined whether it is necessary to align the phase of sub-signals that are transmitted through the dither arm 32 with the phase of the sub-signal that is transmitted through the reference arm 30. As is known in the art, proper phase alignment is necessary for constructive interference of the sub-signals and consequently a maximum power for the primary amplified signal. Preferably, each dither arm 32 includes a phase controller 52 with a dither detector 56 as described above for accomplishing this step.

If the dither detector 56 indicates that the phase of the sub-signal in the dither arm 32 needs to be aligned with the phase of the sub-signal in the reference arm 30, then the phase controller 52 may use a phase adjusting element 78 to either advance or retard the phase of the sub-signal. The phase adjusting element 78 may be a semiconductor laser, a piezoceramic device, or other suitable devices. Then, the sequence proceeds to step 114.

In step 114, it is determined whether it is necessary to align the polarization of sub-signals that are transmitted through the dither arm 32 with the polarization of the sub-signal that is transmitted through the reference arm 30. As is known in the art, the sub-signals must have approximately equal polarization in order for there to be efficient constructive interference of the sub-signals and a maximum power for the primary amplified signal. Preferably, each dither arm 32 also includes a polarization controller 54 as described above for accomplishing this step.

If the dither detector 56 indicates that the polarization of the sub-signal in the dither arm 32 needs to be aligned with the polarization of the sub-signal in the reference arm 30, then the polarization controller 54 may use a polarization adjusting element 80 to change the polarization of the sub-signals. The phase adjusting element 78 may be a piezoelectric transducer used for stressing the fiber, a piezoceramic device, a liquid crystal, or any other suitable material.

While particular embodiments of the invention have been shown and described, numerous variations and alternate embodiments will occur to those skilled in the art. Accordingly, it is intended that the invention be limited only in terms of the appended claims.

What is claimed is:

1. An optical combiner for amplifying an optical signal, the optical combiner splitting the optical signal into a plurality of sub-signals, the optical combiner comprising:
   a plurality of amplifiers receiving the plurality of sub-signals and amplifying the plurality of sub-signals so as to produce a plurality of amplified sub-signals for transmission through a plurality of amplifier outputs;
   a combining coupler having a plurality of coupler inputs and a coupler output, said plurality of coupler inputs being coupled to said plurality of amplifier outputs and receiving said plurality of amplified sub-signals, said combining coupler combining said plurality of amplified sub-signals into a primary amplified signal for transmission through said coupler output; and
   at least one phase controller coupled between said coupler output and said plurality of amplifiers, said at least one phase controller receiving a secondary amplified signal from said primary amplified signal and adjusting the phase of at least one of said plurality of sub-signals to increase the power of said primary amplified signal.

2. The optical combiner of claim 1 further comprising:
   a splitter is selected from the group consisting of at least one 50:50 splitter and at least 1×N splitter.

3. The optical combiner of claim 1 wherein said plurality of amplifiers comprises a plurality of semiconductor lasers.

4. The optical combiner of claim 3 further comprising:
a doped optical waveguide element having one of said plurality of semiconductor lasers coupled thereto for lasing said doped optical waveguide element at a predetermined wavelength and producing one of said plurality of amplified sub-signals;
a plurality of gain tap couplers coupled to said doped optical waveguide element and drawing a plurality of optical feedback signals from said plurality of amplified sub-signals;
a plurality of optical-to-electrical converters coupled to said plurality of gain tap couplers and receiving said plurality of optical feedback signals, said plurality of optical-to-electrical converters converting said plurality of optical feedback signals into a plurality of electrical feedback signals; and
a plurality of gain controllers coupled to said plurality of optical-to-electrical converters and receiving said plurality of electrical feedback signals, said plurality of gain controllers adjusting a power supply to said plurality of semiconductor lasers for the purpose of stabilizing the gain of said plurality of sub-signals.

5. The optical combiner of claim 3 wherein a first gain controller is in communication with at least one other gain controller so as to stabilize the gain with said at least one other gain controller.

6. The optical combiner of claim 3 wherein said plurality of gain controllers includes a predetermined power value for stabilizing the gain across said plurality of amplifiers.

7. The optical combiner of claim 1 further comprising:
a polarization controller operatively coupled between said coupler output and said plurality of amplifiers, said at least one polarization controller receiving a secondary amplified signal from said primary amplified signal and adjusting the polarization of at least one of said plurality of sub-signals to increase the power of said primary amplified signal, wherein said phase controller and said polarization controller each include a dither detector.

8. The optical combiner of claim 7 wherein said dither detector comprises:
a band pass filter operatively coupled to said coupler output of said combining coupler and receiving said secondary amplified signal, said band pass filter passing a filtered signal at a predetermined frequency;
a square wave generator producing a first sinusoidal signal at said predetermined frequency;
a phase modulator coupled to said square wave generator, said phase modulator receiving said first sinusoidal signal and aligning said first sinusoidal signal in phase with said filtered signal;
a mixer coupled to said band pass filter and said phase modulator, said mixer receiving said filtered signal from said band pass filter and said square wave signal from said phase modulator, said mixer multiplying said filtered signal by said first sinusoidal signal and producing a composite signal;
an integrator coupled to said mixer and receiving said composite signal, said integrator producing an average DC voltage;
a low pass filter coupled to said square wave generator and allowing a second sinusoidal signal to pass therethrough;
a summer coupled to said integrator and said low pass filter, said summer combining said average DC output and said second sinusoidal signal into a dither output; and
a drive amplifier coupled to said summer and receiving said dither output, said drive amplifier amplifying said dither output and producing a current that drives an at least one of a phase adjusting element and a polarization adjusting element.

9. The optical combiner of claim 7 wherein said phase adjusting element is selected from the group consisting of a piezoceramic element and a semiconductor laser, said polarization adjusting element being selected from the group consisting of a piezoelectric transducer, a piezoceramic device, and a liquid crystal.

10. A satellite system comprising:
a first satellite orbiting the earth;
a second satellite orbiting the earth and in communication with said first satellite;
wherein said first satellite and said second satellite each include at least one high power optical combiner comprising:
a splitter having a splitter input and a plurality of splitter outputs, wherein said splitter input receives an optical signal and said splitter splits said optical signal into a plurality of sub-signals that are transmitted through said plurality of splitter outputs;
a plurality of arms coupled to said plurality of splitter outputs and transmitting said plurality of sub-signals in parallel, said plurality of arms characterized by a reference arm and at least one dither arm;
a plurality of amplifiers coupled to said plurality of arms wherein said plurality of amplifiers amplifies said plurality of sub-signals and produces a plurality of amplified sub-signals;
a combining coupler having a plurality of coupler inputs and a coupler output, said plurality of coupler inputs being coupled to said plurality of arms and receiving said plurality of amplified sub-signals, said combining coupler combining said plurality of amplified sub-signals into a primary amplified signal that is transmitted through said coupler output;
a dither tap coupler coupled to said coupler output and drawing a secondary amplified signal from said primary amplified signal;
at least one phase controller coupled to said coupler output and receiving said secondary amplified signal, said at least one phase controller also coupled to said at least one dither arm between said splitter and one of said plurality of amplifiers; and
at least one polarization controller coupled to said coupler output and receiving said secondary amplified signal, said at least one polarization controller also coupled to said at least one dither arm between said splitter and one of said plurality of amplifiers;
wherein said at least one phase controller and said at least one polarization controller include a dither detector and at least one of a phase adjusting element and a polarization adjusting element.

11. The satellite system of claim 10 wherein said splitter is selected from the group consisting of at least one 50:50 splitter and at least one 1×N splitter.

12. The satellite system of claim 10 wherein said plurality of amplifiers comprises a plurality of semiconductor lasers.

13. The satellite system of claim 12 further comprising:
a doped section within each of said plurality of arms, said doped section having one of said plurality of semiconductor lasers coupled thereto for lasing said doped section at a predetermined wavelength and producing one of said plurality of amplified sub-signals;
a plurality of gain tap couplers coupled to said plurality of arms and drawing a plurality of optical feedback signals from said plurality of amplified sub-signals;

a plurality of optical-to-electrical converters coupled to said plurality of gain tap couplers and receiving said plurality of optical feedback signals, said plurality of optical-to-electrical converters converting said plurality of optical feedback signals into a plurality of electrical feedback signals; and a plurality of gain controllers coupled to said plurality of optical-to-electrical converters and receiving said plurality of electrical feedback signals, said plurality of gain controllers adjusting a power supply to said plurality of semiconductor laser for the purpose of stabilizing the gain of said plurality of sub-signals.

14. The satellite system of claim 12 wherein a first gain controller is in communication with at least one other gain controller so as to stabilize the gain with said at least one other gain controller.

15. The satellite system of claim 12 wherein said plurality of gain controllers includes a predetermined power value for stabilizing the gain across said plurality of amplifiers.

16. The satellite system of claim 10 wherein said dither detector comprises:

a band pass filter coupled to said tap coupler and receiving said secondary amplified signal, said band pass filter passing a filtered signal at a predetermined frequency;

a square wave generator producing a first sinusoidal signal at said predetermined frequency;

a phase modulator coupled to said square wave generator, said phase modulator receiving said first sinusoidal signal and aligning said first sinusoidal signal in phase with said filtered signal;

a mixer coupled to said band pass filter and said phase modulator, said mixer receiving said filtered signal from said band pass filter and said square wave signal from said phase modulator, said mixer multiplying said filtered signal by said first sinusoidal signal and producing a composite signal;

an integrator coupled to said mixer and receiving said composite signal, said integrator producing an average DC voltage;

a low pass filter coupled to said square wave generator and allowing a second sinusoidal signal to pass therethrough;

a summer coupled to said integrator and said low pass filter, said summer combining said average DC output and said second sinusoidal signal into a dither output; and a drive amplifier coupled to said summer and receiving said dither output, said drive amplifier amplifying said dither output and producing a current that drives at least one of said phase adjusting element and said polarization adjusting element.

17. The high power optical combiner of claim 10 wherein said phase adjusting element is selected from the group consisting of a piezoceramic element and a semiconductor laser, said polarization adjusting element being selected from the group consisting of a piezoelectric transducer, a piezoceramic device, and a liquid crystal.

18. A method for amplifying an optical signal comprising:

splitting the optical signal into a plurality of sub-signals;

transmitting said plurality of sub-signals through a plurality of arms;

amplifying said plurality of sub-signals and producing a plurality of amplified sub-signals;

drawing a plurality of optical feedback signals from said plurality of amplified sub-signals;

converting said plurality of optical feedback signals into a plurality of electrical feedback signals;

determining whether the gain is approximately equal among said plurality of arms;

combining said plurality of amplified sub-signals to produce a primary amplified output;

determining whether phase alignment of one of said plurality of sub-signals is necessary;

determining whether adjustment of the polarization of one of said plurality of sub-signals is necessary; and advancing the phase of one of said plurality of sub-signals;

retarding the phase of one of said plurality of sub-signals; and changing the polarization of said plurality of sub-signals.

19. The method of claim 18 wherein said determining whether the gain is approximately equal among said plurality of arms comprises comparing one of said plurality of electrical feedback signals to a predetermined power value.

20. The method of claim 18 wherein said determining whether the gain is approximately equal among said plurality of arms comprises comparing a first electrical feedback signal from a first arm to a second electrical feedback signal of a second arm.

* * * * *

UNITED STATES PATENT AND TRADEMARK OFFICE
CERTIFICATE OF CORRECTION

PATENT NO. : 6,614,591 B1
DATED : September 2, 2003
INVENTOR(S) : Thomas Robert Cooper and Joshua Aaron Conway

It is certified that error appears in the above-identified patent and that said Letters Patent is hereby corrected as shown below:

Column 8,
Line 64, change "is" to -- being --; therefore Claim 2 should read:
    The optical combiner of claim 1 further comprising:
        a splitter being selected form the group consisting of
at least one 50-50 splitter and at least 1xN splitter.

Column 10,
Line 3, remove "an" from Claim 8.

Signed and Sealed this

Sixth Day of April, 2004

JON W. DUDAS
*Acting Director of the United States Patent and Trademark Office*